United States Patent [19]

Notsu et al.

[11] Patent Number: 6,030,712

[45] Date of Patent: *Feb. 29, 2000

[54] PRINTING PLATE MATERIALS AND A METHOD OF PRODUCING THE SAME

[75] Inventors: Kazuo Notsu, Amagasaki; Yoshinori Funaki, Himeji, both of Japan

[73] Assignee: Daicel Chemical Industries, Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/416,734

[22] PCT Filed: Aug. 10, 1994

[86] PCT No.: PCT/JP94/01318

§ 371 Date: Apr. 12, 1995

§ 102(e) Date: Apr. 12, 1995

[87] PCT Pub. No.: WO95/05287

PCT Pub. Date: Feb. 23, 1995

[51] Int. Cl.$^7$ .......................... B32B 27/08; B32B 27/18; B32B 27/20; B32B 27/36
[52] U.S. Cl. .......................... 428/480; 428/323; 428/481; 428/483; 428/532; 428/910; 430/269; 430/270.1; 430/271.1; 430/300; 430/302; 430/303; 430/307; 430/531; 430/532; 430/533; 430/908; 430/911; 430/945
[58] Field of Search .................................. 428/323, 480, 428/483, 532, 910, 914; 106/20 B, 19 D, 19 F, 264, 472; 430/269, 270.1, 271.1, 300, 302, 303, 307, 531, 533, 911, 908, 945

[56] References Cited

U.S. PATENT DOCUMENTS

| | | | |
|---|---|---|---|
| 3,218,971 | 11/1965 | Rowland et al. | 101/401.1 |
| 3,642,507 | 2/1972 | Olhoft et al. | 106/182 |
| 3,964,389 | 6/1976 | Peterson | 101/467 |
| 4,036,130 | 7/1977 | Giori | 101/170 |
| 5,262,275 | 11/1993 | Fan | 430/273 |
| 5,324,617 | 6/1994 | Majima et al. | 430/138 |
| 5,396,841 | 3/1995 | Guls | 101/395 |
| 5,506,086 | 4/1996 | Van Zoeren | 430/201 |

FOREIGN PATENT DOCUMENTS

| | | |
|---|---|---|
| 0306932 | 3/1989 | European Pat. Off. . |
| 5135144 | 9/1971 | Japan . |
| 516569 | 1/1974 | Japan . |
| 51-44001 | 4/1976 | Japan . |
| 4-59392 | 2/1992 | Japan . |
| 4-67949 | 3/1992 | Japan . |
| 5-8367 | 1/1993 | Japan . |

OTHER PUBLICATIONS

Patent Abstracts of Japan, vol. 9, No. 26, p. 332 of JP59171025, Sep. 1984.
Patent Abstracts of Japan, vol. 9, No. 48, p. 338 of JP59186128, Oct. 1984.

*Primary Examiner*—Vivian Chen
*Attorney, Agent, or Firm*—Birch, Stewart, Kolasch & Birch, LLP

[57] ABSTRACT

A printing plate material producing prints with inhibited background staining is provided by formation of a photosensitive layer comprising nitrocellulose, a black coloring agent, e.g. carbon black, and an organic binder and having (1) a surface roughness of not greater than Rmax. 2.0 $\mu$m or (2) a surface tension equivalent to a wettability index of not greater than 36 dyn/cm on a support. The nitrocellulose has a nitrogen content of 11 to 12.5% and a solution viscosity of about 1 to $\frac{1}{8}$ second. The organic binder includes polyester resins such as solvent-soluble, noncrystal-line, linear, oil-free aromatic polyesters. Based on 100 parts by weight of the organic binder, the amount of nitrocellulose is about 5 to 300 parts by weight and that of the black coloring agent is about 0.5 to 50 parts by weight. The photosensitive layer may contain a crosslinking agent, e.g. melamine resin, and/or a water repellent, e.g. a silicone compound or a fluorine-containing compound. The support includes a polyethylene terephthalate film having an average density of less than 1.39 g/cm$^3$.

8 Claims, No Drawings

# 6,030,712

PRINTING PLATE MATERIALS AND A METHOD OF PRODUCING THE SAME

TECHNICAL FIELD

This invention relates to a printing plate material which can be sculptured with laser light for use in gravure printing, among other uses, and to a method for its production.

BACKGROUND TECHNOLOGY

A laser-sculptured printing plate material is known which comprises a mixture of polyethylene and carbon black as molded in the form of a sheet. However, this material requires high-energy laser radiation for creating a concave-convex (three-dimensional) pattern on its surface. For this reason, any printing plate material on which a three-dimensional pattern can be produced with a low-energy laser radiation has not been commercially implemented yet.

Meanwhile, a recording material supplemented with nitrocellulose for enhanced sensitivity is known but this material is deficient in the strength required of any printing plate. By way of example, Japanese Patent Publication No. 51-35144 discloses an image forming technology which comprises coating a support with a photosensitive composition containing nitrocellulose and carbon black and irradiating the coated support with laser light from behind the support to form an image. Described in this prior art literature is an embodiment in which an ink is transferred to the photo-sensitive layer for printing. Moreover, Japanese Patent Application Laid-open No. 5-8367 discloses a gravure printing plate material having a photosensitive layer containing nitrocellulose and carbon black. However, these photosensitive layers are invariably of low strength so that the final materials are not practically useful as printing plates.

The strength of a printing plate material is not only dependent on the strength of the photosensitive layer but also on the strength of the support. For example, when a crystalline polyester film, for example a biaxially-oriented polyethylene terephthalate film, is used for the support, its strength varies according to processing conditions such as coating with a photo-sensitive composition. Thus, the inherent performance characteristics of the crystalline polyester are not fully expressed so that the printing plate may not be imparted with sufficiently high strength.

Furthermore, any printing plate material is required to have a high degree of surface smoothness in order to preclude background staining of the print due to residues of the printing ink on the plate surface. However, the surface smoothness of the printing plate manufactured by using a photosensitive composition containing nitrocellulose and carbon black is not so high. The rough plate surface is not conducive to soil-free prints.

Particularly when the printing ink is a water-based ink which is easy to handle and high in safety and hygienics, it is difficult to scrape off the excess ink from the printing plate with a blade even if the plate has a smooth surface, probably because the ink used has a higher surface tension than the gravure printing ink containing an organic solvent. The failure to clean the plate surface thoroughly with a blade leads to ink residues on the plate and, hence, stained prints.

Japanese Patent Publication No. 51-6569 discloses an image-forming printing plate material having a photosensitive layer containing nitrocellulose as a self-oxidative binder, carbon black as a particulate pigment capable of absorbing laser energy, and melamine resin as a curing agent (crosslinking agent). This literature describes examples in which an alkyd resin, a methyl methacrylate resin, a butyral resin, an epoxy resin or a novolac resin is further used. However, the photosensitive material described in the above literature is designed for use in the process for producing a lithographic or planographic printing plate which comprises contacting the photosensitive coating layer coated on a support with the polyvinyl alcohol coating layer coated on an aluminum plate and irradiating them with laser light from behind the support to thereby transfer an image corresponding to the irradiated area to the aluminum plate. Therefore, it is not a printing plate belonging to the category in which a printing ink is directly transferred on a photosensitive layer for printing. Moreover, the sensitivity and film strength of the photosensitive layer formed with the photosensitive material are not sufficiently high so that the product can hardly be used, as it is, as a printing plate.

Therefore, it is an object of the present invention to provide a printing plate material on which a concave-convex (three-dimensional) pattern can be formed even at a low laser energy output and which has a high film strength and a method of producing the printing plate material.

It is a further object of the present invention to provide a printing plate material havig a high sensitivity relative to laser light and useful to form a concave-convex pattern with high accuracy and a method of producing the printing plates material.

It is a still further object of the present invention to provide a printing plate material which can be used in a printing process comprising transferring a printing ink directly on the surface of its layer having a concave-convex pattern produced with laser light and has excellent strength, durability and wear resistance (printing pressure resistance) in association with printing and a method of producing the printing plate material.

It is still another object of the present invention to provide a printing plate material having a high degree of surface smoothness and inhibiting a background staining of the print and a method of producing the printing plate material.

A further object of the present invention is to provide a printing plate material which can be cleaned by scraping off an excess of printing ink from its surface by means of a blade even when a water-based printing ink is employed and, therefore, provides for a minimum background staining of the print and a method of producing the printing plate material.

DISCLOSURE OF INVENTION

The inventors of the present invention did intensive research to accomplish the above-mentioned objects and found that by forming a photosensitive layer comprising nitrocellulose, a black coloring agent and an organic binder, a printing plate material having a photosensitive layer which is highly thermodegradable on exposure to laser radiation and has a high film strength can be obtained and that the surface smoothness and surface tension of the photosensitive layer affect remarkably on printability. The present invention has been developed on the basis of the above findings.

Thus, the printing plate material of the present invention comprises a photosensitive layer comprising nitrocellulose, a black coloring agent and an organic binder and a support on which the photosensitive layer is formed, the photosensitive layer having (1) a surface roughness of not greater than Rmax. 2.0 $\mu$m or (2) a surface tension of not more than 36 dyn/cm in terms of wettability index. As the nitrocellulose, a variety of nitrocelluloses which can be thermally decomposed with laser light, for example a nitrocellulose with a nitrogen content of 10 to 14%, a degree of polymerization within the range of 10 to 1500, and a solution viscosity according to Japanese Industrial Standards (JIS) K6703 of about 20 to 1/10 second. The black coloring agent includes a variety of substances capable of absorbing laser light, for example, carbon black. The organic binder includes a variety of film-formable organic polymers such as polyester resins. For improved strength, the photosensitive layer may contain a crosslinking agent. Furthermore, the photosensitive layer may contain a water repellent for controlling the surface wettability index.

In another embodiment of the present invention, a photosensitive layer of the printing plate material comprises nitrocellulose, a black coloring agent, and a polyester resin.

As the support, a flexible transparent support such as a biaxially oriented polyethylene terephthalate film may be used. Since the support affects on the strength of the printing plate material, the density of the polyethylene terephthalate film support is preferably less than 1.39.

The above printing plate material can be used for gravure printing, flexo printing, etc. and, as the printing ink, a water-based printing ink is usually employed.

The above printing plate may be manufactured by coating a support, for example a biaxially oriented polyethylene terephthalate film having a density of less than 1.39, with a coating composition comprising nitrocellulose, a black coloring agent and an organic binder to provide a photosensitive layer which can be sculptured with laser light. The coating composition mentioned above may further contain a crosslinking agent and/or a water repellent.

As used throughout this specification, the term "film" includes a sheet unless otherwise specified.

DETAILED DESCRIPTION OF THE INVENTION

The species of nitrocellulose to be incorporated in the photosensitive layer is not particularly restricted only if it is thermally degradable. The nitrogen content of the nitrocellulose is generally about 10 to 14%, preferably about 11 to 12.5%, and more preferably about 11.5 to 12.2%. The degree of polymerization of the nitrocellulose can also be liberally selected within a broad range of, for example, about 10 to 1,500. The preferred degree of polymerization of nitrocellulose may, for example, be about 10 to 900 and particularly about 15 to 150. The preferred nitrocellulose includes a nitrocellulose with a solution viscosity of about 20 to 1/10 second, preferably about 10 to 1/8 second, as determined in accordance with JIS K6703 "Industrial Cellulose" (the viscosity denomination of Hercules Powder Company). The practically used nitrocellulose has a solution viscosity of about 5 to 1/8 second, particularly about 1 to 1/8 second. If necessary, two or more species of nitrocellulose can be used in combination.

The amount of nitrocellulose may be selected from the range not adversely affecting the sensitivity of the photosensitive layer and may be about 5 to 300 parts by weight, preferably about 20 to 200 parts by weight, and more preferably about 30 to 150 parts by weight relative to 100 parts by weight of the organic binder. The nitrocellulose may be practically used in an amount of 5 to 100 parts by weight relative to 100 parts by weight of the organic binder.

The black coloring agent includes a variety of absorbents which absorb laser energy with high efficiency, for example black dyes and carbon black. The preferred species of the black coloring agent includes carbon black and insofar as a high dispersion stability can be imparted to the composition, any of the species defined in ASTM and/or indicated for whatever uses (e.g.colors, rubber, dry batteries, etc.) can be employed. For example, the carbon black includes furnace black, thermal black, channel black, lamp black and acetylene black and the like.

The black coloring agent such as carbon black can be used in the form of color chips or a color paste, which can be prepared by dispersing it in nitrocellulose and/or an organic binder beforehand, in which case the dispersion thereof is facilitated. Such chips and paste are readily available from commercial sources.

The amount of the black coloring agent may be selected from the range not adversely affecting the sensitivity of the photosensitive layer and may be, for example, about 0.5 to 50 parts by weight, preferably about 5 to 40 parts by weight, and more preferably about 10 to 35 parts by weight relative to 100 parts by weight of the organic binder. The black coloring agent may be used practically in an amount of 10 to 40 parts by weight relative to 100 parts by weight of the organic binder.

The type of organic binder is not particularly resistricted unless it does not adversely affect the laser light sensitivity and printing pressure resistance and, for example, includes thermosettable resins such as a phenolic resin, an epoxy resin, a vinyl ester resin, etc., thermoplastic resins such as a polyvinyl chloride, an acrylic resin, a styrenic resin, a polycarbonate, a polyester resin, a polyamide, etc., and other resins such as naturally-occurring resins. These organic binders may be used singly or in combination.

The preferred organic binder includes thermoplastic resins, particularly those resins which can be cured with a crosslinking agent. The preferred binder includes polyester resins which can be provided with high sensitivity to laser light and are highly solvent- and wear-resistant, particularly aromatic polyesters. When the nitrocellulose, black coloring agent and polyester resin are used in combination, a concave-convex pattern (three-dimensional pattern) can be formed with high precision even at a low laser energy output and, in addition, the film strength of the photosensitive layer can be increased. Furthermore, a high printing press resistance can be expected even when a printing ink is directly transferred to the three-dimentionally patterned photosensitive layer.

As the polyester resin, a variety of polyesters obtainable by condensing a polycarboxylic acid or an acid anhydride or lower alcohol ester thereof with a polyhydric alcohol can be employed. Moreover, hydroxycarboxylic acids may also be used in the condensation reaction.

The polycarboxylic acid component includes, for example, aromatic carboxylic acids such as phthalic acid, isophthalic acid, terephthalic acid, a methyl-substituted terephthalic acid, trimellitic acid, pyromellitic acid, etc. and the corresponding anhydrides;. saturated or unsaturated aliphatic carboxylic acids such as succinic acid, glutaric acid, adipic acid, azelaic acid, sebacic acid, maleic acid, fumaric acid, etc. and the corresponding anhydrides. The practically preferred polycarboxylic acid component includes aromatic dicarboxylic acids such as phthalic acid, isophthalic acid, terephthalic acid, etc. and the corresponding anhydrides, and saturated aliphatic dicarboxylic acids such as adipic acid, azelaic acid, sebacic acid and so on. The hydroxycarboxylic acid includes, for example, β-hydroxypropionic acid, β-hydroxybutyric acid and so on.

As the polyhydric alcohol component, there may be mentioned, for example, aliphatic dihydric alcohols such as ethylene glycol, propylene glycol, trimethylene glycol, 1,3-butanediol, 1,4-butanediol, 1,5-pentanediol, 1,6-hexanediol, neopentyl glycol, etc., polyoxyalkylene glycols such as diethylene glycol, triethylene glycol, tetraethylene glycol, dipropylene glycol, tripropylene glycol, tetrapropylene glycol, etc., aliphatic polyhydric alcohols such as glycerin, trimethylolpropane, trimethylolethane, pentaerythritol, etc., alicyclic polyhydric alcohols such as a cyclohex-anediol, hydrogenated bisphenol A, etc., and aromatic polyhydric alcohols such as bisphenol A-alkylene oxide adducts, e.g. 2,2-bis(4-dihydroxyethylphenyl)propane and 2,2-bis(4-dihydroxypropylphenyl)propane, among others.

The polyester resin may have hydroxyl and/or carboxyl groups. The molecular weight of polyester resin may for example be about 1000 to 100000, and preferably about 2000 to 50000.

The preferred polyester resin is generally a linear polyester which is soluble in organic solvents and non-crystalline. Such polyester resin includes aromatic ring-containing polyesters such as oil-free aromatic polyesters having high resistance to solvents and wear. The aromatic ring of the polyester is usually derived from an aromatic polycarboxylic acid such as terephthalic acid, phthalic acid, isophthalic acid and so on. Such polyester resins include modified polyesters (modified polyethylene terephthalate) prepared by partial replacement of the ethylene glycol and/or terephthalic acid unit of polyethylene terephthalate with a different diol (e.g. triethylene glycol, cyclohexanedimethanol, etc.) and/or dicarboxylic acid (e.g. phthalic acid, isophthalic acid, adipic acid, etc.).

For inhibition of background staining of prints, the above-mentioned photosensitive layer preferably contains a water repellent. As examples of the water repellent, there may be mentioned silicone compounds represented by organosiloxanes (e.g. silicone oils such as polydimethylsiloxane, polydiphenylsiloxane, polymethylphenylsiloxane, etc., modified silicones such as a polyether-modified dimethylsiloxane, an amino-modified polydimethylsiloxane, etc., silicone gum (gum-like silicone), silicone rubber, silane coupling agents containing a reactive group such as amino, glycidyl, methoxy, etc.), fluorine compounds represented by fluorocarbons (e.g. low molecular weight compounds such as fluorocarbon, benzotrifluoride, perfluorobenzene, perfluoromethyldecaline, a homo- or co-polymer of chlorotrifluoroethylene which has a lower degree of polymerization, etc. and polymers such as fluororesin, a homo- or co-polymer of fluorine-containing (meth)acrylic monomer, etc.), and those copolymers and graft polymers which contain an organosiloxane or fluorocarbon unit. The copolymers and graft copolymers mentioned just above include a functional comb-shaped graft copolymer which is obtainable by copolymerizing a macromonomer with functional monomers (for example unsaturated compounds such as fluorine- or silicon-containing acrylic monomers) and these polymers are commercially available from Toagosei Chemical Industry Co., Ltd., Japan as "Aron G Series" fluorine-containing graft polymers and silicone graft polymers. These water repellents are generally nonvolatile at room temperature and either liquid, viscous or resinous.

These water repellents can be obtained from commercial sources. Thus, polydimethylsiloxane, among silicone water repellents, is available from Toshiba Silicone Co., Ltd. under the tradename of TSF-451-100 and TSF-451-1M, and silicone gums can be obtained from Shin-Etsu Silicone Co., Ltd. A silicone comb-shaped polymer water repellent is available from Toagosei Chemical Industry Co., Ltd. under the tradename of Aron G GS-30. A fluorine-containing comb-shaped polymer water repellent is also available from Toagosei Chemical Industry Co., Ltd. as the tradename of Aron G GF-300. A fluorine- and silicon-containing comb-shaped polymer water repellent may be purchased from Toagosei Chemical Industry Co., Ltd. under the tradename of Aron G GF-150.

The amount of the water repellent relative to the photo-sensitive layer may be selected from the range providing a wettability index (surface tension) of not more than 36 dyne/cm, preferably 30 to 36 dyne/cm and more preferably 32 to 36 dyne/cm to the surface of the printing plate. The proportion of the water repellent relative to 100 parts by weight of the photo-sensitive layer in terms of the nonvolatile content of the photosensitive coating composition is generally about 0.1 to 5 parts by weight, preferably about 0.15 to 4 parts by weight, and more preferably about 0.2 to 3 parts by weight. Practically, the water repellent is used in a proportion of about 0.2 to 2 parts by weight relative to 100 parts by weight of the photosensitive layer. If the surface wettability index of the printing plate exceeds 36 dyn/cm, background stain of the print occurs to detract from the degree of definition or visibility of the print. Particularly when a water-based printing ink such as a water-based gravure printing ink or a water-based flexo printing ink is employed, such staining or soling of prints is prominent. When a printing plate with a surface tension within the above range is employed, residues of the printing ink on the plate can be efficiently scraped off with a doctor blade so that background stain of the print due to the residual ink can be prevented. Thus, a print of sharp image definition can be produced.

Where necessary, a crosslinking agent is incorporated in the photosensitive layer. The crosslinking agent includes, for example, amino resins such as a melamine resin, a benzoguanamine resin, a urea resin, etc. and organic peroxides such as benzoyl peroxide, di-t-butyl peroxide, methyl ethyl ketone peroxide, etc. As specific melamine crosslinking agents that can be obtained from commercial sources, the tradename "Super-Beckamine L-105-60" (Dainippon Ink and Chemicals, Inc.), the tradename "Cymel 325" and "Cymel 303" (Mitsui-Cyanamid, Co., Ltd.), etc. can be mentioned.

The proportion of the crosslinking agent may for example be about 0.1 to 40 parts by weight and preferably about 1 to 30 parts by weight relative to 100 parts by weight of the polyester resin.

If required, the photosensitive layer may further contain a variety of additives, for example, plasticizers, antioxidants, ultraviolet absorbers or other aging inhibitors, cure accelerators, acid catalysts (e.g. the tradename "BYK catalyst 450"; BYK Co. which has a block type p-toluenesulfonic acid as a main component), flame retardants, fillers, coloring agents, levelling agents and so on.

The shape of the support is not restricted only if it is a printable form and may for example be drum-like, film-like or sheet-like. For irradiation with laser beams through the support, a laser light-transparent support is used as the support. Since the printing plate is put to use as wrapped around the drum (printing drum) of a printing machine, the support is usually supplied in the form of a film or sheet. Although the material of the support is not particularly limited, a transparent plastic film is usually employed when a support of film or sheet form is chosen. For the plastic film, a variety of films including polypropylene, polyester and polyamide films can be employed and these films are generally used in stretched or oriente form, particularly in the form of a biaxially stretched or oriented film. In view of their toughness and dimensional accuracy or stability of pits, which are formed by laser beam irradiation, of the photosensitive layer in the printing process, polyalkylene terephthalates such as polyethylene terephthalate, polybutylene terephthalate, etc. and especially polyethylene terephthalate are preferred.

With regard to polyethylene terephthalate film, films of various grades can be employed but a film of the printing plate grade is preferred from the standpoint of accuracy of thickness, surface smoothness and other parameters. In the case of polyethylene terephthalate film, its average density has an important role on impact resistance. Thus, when the average density of polyethylene terephthalate film is less than 1.39 and preferably 1.375 to 1.387, the impact resistance of the film is so high that the strength, durability and printing press resistance of the printing plate are enhanced. The impact resistance of film is not affected by heat treatment but when its average density is higher than 1.39, the impact resistance of polyethylene terephthalate film is decreased probably because the degree of crystallization is increased as the synergistic effect of the coating composition, the printing ink and the heat applied in the coating process and/or in the printing process. While the degree of crystallization varies from the surface to the inner part of film, the impact resistance of film is sharply decreased when its average density exceeds 1.39.

The thickness of the support film can be suitably selected within the range providing for a high mechanical strength and, sufficient flexibility of the printing plate and may, for example, be about 50 to 500 $\mu$m, preferably about 75 to 300 $\mu$m. It should be noted that when such a thicker film is employed, the impact resistance may decrease considerably upon application of the coating composition.

To preclude background staining of the print due to residues of the printing ink on the printing plate, the photosensitive layer formed on the support should preferably present a smooth surface. The surface roughness Rmax. of the photosensitive layer is generally not greater than about 2.0 $\mu$m, preferably not greater than about 1.5 $\mu$m (e.g. about 0.1 to 1.2 $\mu$m), and more preferably not greater than about 1.0 $\mu$m (e.g. about 0.1 to 0.8 $\mu$m). When Rmax. is not greater than 1.0 $\mu$m, background staining of the print can be certainly precluded. With a printing plate having a highly surface smooth photosensitive layer, residues of the printing ink on the printing plate can be efficiently scraped off so that background staining of the print due to the residual ink can be prevented. For this reason, a print of good image definition can be obtained even with a water-based printing ink.

The surface of the more preferred photosensitive layer has a surface roughness Rmax. of not greater than 2.0 $\mu$m (preferably not greater than 1.5 $\mu$m) and a wettability index of not greater than 36 dyne/cm (preferably about 32 to 36 dyne/cm).

The thickness of the photosensitive layer formed on the support can be selected within the range not adversely affecting the durability of the photosensitive layer and may, for example, be 1 to 100 $\mu$m, preferably about 10 to 50 $\mu$m, and practically about 15 to 30 $\mu$m.

If necessary, an adhesive layer or a under coating layer may be interposed between the photosensitive layer and the support, or the support may be surface-treated. Further, an antistatic layer may be formed on the reverse or opposite side of the support with respect to the photosensitive layer.

The above-mentioned photosensitive layer may be formed by coating such a support with a coating composition comprising nitrocellulose, a black coloring agent and an organic binder. The coating composition may be prepared by mix-dispersing the nitrocellulose, black coloring agent and organic binder in an organic solvent using the conventional mixer or dispersing machine.

To achieve an enhanced surface smoothness of the photosensitive layer, the black coloring agent (carbon black) is preferably highly dispersed. The dispersibility of the coloring agent can be controlled by adjusting the dispersing mixer shearing force, system viscosity, the proportion of nitrocellulose and/or organic binder relative to the coloring agent, and dispersing time. Within the range not adversely affecting the printing performance and printing press resistance, a surfactant or other dispersing agent may be incorporated to achieve an increased dispersibility of the coloring agent.

The organic solvent mentioned hereinbefore includes, for example, alcohols such as ethanol, isopropyl alcohol, etc., aliphatic hydrocarbons such as hexane, octane, etc.; alicyclic hydrocarbons such as cyclohexane etc., aromatic hydrocarbons such as benzene, toluene, xylene, etc., halogenated hydrocarbons such as dichloromethane, dichloroethane, etc., ketones such as acetone, methyl ethyl ketone, methyl isobutyl ketone, etc., esters such as ethyl acetate, butyl acetate, etc., ethers such as diethyl ether, tetrahydrofuran, cellosolve, carbitol, etc., and various mixtures thereof.

As the photosensitive layer formed in the above manner is irradiated with laser light image-wise, i.e. in accordance with a predetermined pattern, there is obtained a printing plate having a three-dimensional pattern (pits) in the photosensitive layer. Where the support is transparent, the laser beam may be projected from the support side to the photosensitive side but, in many instances, irradiation is performed from the photosensitive layer side. As the source of laser radiation, there may be used various types of lasers such as Ar lasers, He—Ne lasers, etc., long-wavelength lasers whose emissions are readily absorbed by the black coloring agent, such as carbon black, to produce heat, such as a $CO_2$ laser, a YGA laser or a semiconductor laser can be employed with advantage. The preferred laser includes semiconductor lasers which are simple in structure.

INDUSTRIAL APPLICABILITY

The printing plate material of the present invention can be used as the printing plate for gravure printing, flexo printing, etc. and is suited for printing with a water-based printing ink, e.g. a water-based gravure printing ink, a water-based flexo printing ink, and so on.

EXAMPLES

The following examples are intended to describe this invention in further detail and should by no means be interpreted as defining the scope of the invention.

Example 1

A paint shaker preloaded with steel beads (2 mm in diameter) was charged with 14.4 parts by weight of nitrocellulose RS 1/4 (Daicel Chemical Industries, Ltd., isopropyl alcohol-wetted, nonvolatile 70% by weight), 3.7 parts by weight of carbon black (Mitsubishi Chemical Industries Ltd., MA100), 78.1 parts by weight of a polyester resin (Toyobo Co, Ltd., Vylon 20SS, nonvolatile 30% by weight), 10.9 parts by weight of methyl ethyl ketone, 4.3 parts by weight of isopropyl alcohol, and 8.6 parts by weight of toluene were mixed and dispersed by shaking for 120 minutes.

Using an applicator, the resulting coating composition was coated in a dry thickness of 20 μm on a biaxially oriented polyethylene terephthalate film (100 μm thick) and dried at 120° C. for 3 minutes to provide a printing plate material. The surface roughness of the printing plate material was Rmax. 1.2 μm.

Example 2

A coating composition was prepared by mix-dispersing 7.7 parts by weight of nitrocellulose RS 1/4 (Daicel Chemical Industries, Ltd., isopropyl alcohol-wetted, nonvolatile 70% by weight), 24.6 parts by weight of a carbon black paste (Toyo Ink Manufacturing, Co., Ltd., Color Paste ANP-C-903 Black, carbon black content 12% by weight, nitrocellulose content 18% by weight), 43.3 parts by weight of a polyester resin (Toyobo Co., Ltd., Vylon 20SS, nonvolatile 30% by weight), 5.4 parts by weight of a crosslinking agent (Dainippon Ink and Chemicals, Inc., melamine resin, Super-Beckamine L-105-60, nonvolatile 60% by weight), 0.4 part by weight of acid catalyst (BYK Co., BYK Catalyst 450, nonvolatile about 40% by weight), and 18.7 parts by weight of methyl ethyl ketone. Using the resulting coating composition, a printing plate material was prepared in the same manner as in Example 1. The surface roughness of the plate material was Rmax. 0.5 μm.

Example 3

A coating composition was prepared by dispersing together 6.4 parts by weight of nitrocellulose RS 1/4 (Daicel Chemical Industries, Ltd., isopropyl alcohol-wetted, nonvolatile 70% by weight), 29.9 parts by weight of carbon black-containing chips (Taisei Kako, Co., Ltd., TC Color Chip 5307, carbon black content 30% by weight, nitrocellulose content 52% by weight, plasticizer 18% by weight), 97.2 parts by weight of a polyester resin (Toyobo Co., Ltd., Vylon 30SS, nonvolatile 30% by weight), 13.5 parts by weight of a crosslinking agent (Dainippon Ink and Chemicals, Inc., melamine resin, Super-Beckamine L-105-60, nonvolatile 60% by weight), 0.9 part by weight of an acid catalyst (BYK Co., BYK Catalyst 450, nonvolatile about 40% by weight), and 101.6 parts by weight of methyl ethyl ketone. Using the coating composition thus obtained, a printing plate material was obtained in the same manner as in Example 1. The surface roughness of the plate material was Rmax. 0.8 μm.

Comparative Example 1

A printing plate material was obtained in the same manner as Example 1 except that the shaking time for the preparation of a coating composition was 60 minutes. The surface roughness of this plate material was 2.5 μm.

Comparative Example 2

A printing plate material was obtained by repeating the procedure of Example 1 except that the amount of carbon black used and the shaking time in the preparation of a coating composition was 20 parts by weight and 120 minutes, respectively. The surface roughness of the resulting plate material was Rmax. 4.5 μm.

The surface smoothness of the photosensitive layer, the background stain of prints, and the solvent-and water-resistance of the photosensitive layer were evaluated as follows.

Surface smoothness: Evaluated in terms of Rmax, according to the following criteria.

Excellent: Rmax.≦1 μm
Good: Rmax.=1–2 μm
Fair: Rmax.=2–3 μm
Poor: Rmax.>3 μm

Print background stain: The unpatterned printing plate was wrapped around the drum of a modified gravure printing machine and using a water-based printing ink and coated paper, 3000 impressions were made and the resulting prints were evaluated according to the following criteria.

Excellent: No background stain
Good: Slight background stain
Poor: Overt background stain Solvent-resistance of photosensitive layer: The surface of the photosensitive layer was rubbed 10 times with gauze impregnated with ethanol and 1,1,1-trichloroethane (Dow Chemical Co., Chlorothene), and the degree of stain of the gauze was evaluated according to the following criteria.

Excellent: Gauze not stained
Good: Gauze somewhat stained
Poor: Gauze severely stained The wear resistance of the photosensitive layer was evaluated in terms of pencil hardness according to the following criteria.

Excellent:≧2H
Good: H
Poor:≦HB

TABLE 1

| | Surface smoothness | Print background stain | Solvent resistance | Wear resistance |
| --- | --- | --- | --- | --- |
| Example 1 | Good | Excellent | Excellent | Good |
| Example 2 | Excellent | Excellent | Excellent | Excellent |
| Example 3 | Excellent | Excellent | Excellent | Excellent |
| Comparative Example 1 | Fair | Fair | Excellent | Excellent |
| Comparative Example 2 | Poor | Poor | Excellent | Excellent |

It is apparent from Table 1 that the printing plate materials of Examples 1–3, which had high degrees of surface smoothness, produced no print background stain, while the printing plate materials of Comparative Examples 1 and 2, which had rough surfaces, caused background stains.

The sensitivity of the photosensitive layer to laser light and the geometry of pits formed by laser irradiation were evaluated according to the following evaluation schema. Both the sensitivity of the photosensitive layer and the geometry of pits of the printing plate materials according to Examples 1–3 were invariably "excellent".

Sensitivity of photosensitive layer: The photo-sensitive layer was irradiated with a semiconductor laser for a.predetermined time and the depth of pits produced was measured to evaluate its sensitivity according to the following criteria.

Excellent:>12 μm
Good: 12–10 μm
Poor:≦8 μm

Pit geometry or configuration: The pit was examined with an electron microscope and evaluated according to the following criteria.

Excellent: A sharp edge with a rather smooth bottom
Good: A slightly obscure edge with a corrugated bottom
Poor: An obscure edge with a corrugated bottom Examples 4 to 7

A coating composition was prepared by mix-dispersing 7.7 parts by weight of nitrocellulose RS 1/4 (Daicel Chemical Industries, Ltd., isopropyl alcohol-wetted, nonvolatile 70% by weight), 24.6 parts by weight of a carbon black-containing paste (Toyo Ink Manufacturing Co., Ltd., Color Paste ANP-C-903 Black, carbon black content 12% by weight, nitrocellulose content 18% by weight), 43.3 parts by weight of a polyester resin (Toyobo Co., Ltd., Vylon 20SS, nonvolatile 30% by weight), 5.4 parts by weight of a crosslinking agent (Dainippon Ink and Chemicals, Inc., melamine resin, Super-Beckamine L-105-60, nonvolatile 60% by weight), 0.4 part by weight of an acid catalyst (BYK Co., BYK Catalyst 450, nonvolatile about 40% by weight), the predetermined amount (shown below) of a water repellent (a silicone compound or a fluorine-containing compound) and 18.7 parts by weight of methyl ethyl ketone. The amount of the water repellent is based on 100 parts by weight of nonvolatile matter in the coating composition.

Example 4

Polydimethylsiloxane (Toshiba Silicone Co., Ltd., TSF-451-100, 100 cst (25° C.)), 0.2 part by weight

Example 5

Polydimethylsiloxane (Toshiba Silicone, Co., Ltd., TSF-451-1M, 1,000,000 cst (25° C.)), 1.0 part by weight

Example 6

Silicone gum (Shin-Etu Silicone Co., Ltd.), 0.2 part by weight

Example 7

A fluorine-containing compound (Toagosei Chemical Industry, Co., Ltd., Aron G GF-300, fluorine-containing comb-shaped graft polymer), 2.0 parts by weight.

Using an applicator, the coating composition was coated in a dry thickness of 20 μm on a biaxially oriented polyethylene terephthalate film (100 μm thick) and dried at 120° C. for 3 minutes to obtain a printing plate material.

Examples 8 to 10

A coating composition was prepared by mix-dispersing 6.4 parts by weight of nitrocellulose RS 1/4 (Daicel Chemical Industries, Ltd., isopropyl alcohol-wetted, nonvolatile 70% by weight), 29.9 parts by weight of carbon black-containing chips (Taisei Kako Co., Ltd., TC Color Chip 5307, carbon black content 30% by weight, nitrocellulose content 52% by weight, plasticizer 18% by weight), 97.2 parts by weight of a polyester resin (Toyobo Co., Ltd., Vylon 30SS, nonvolatile 30% by weight), 10.1 parts by weight of a crosslinking agent (Mitsui-Cyanamid Co., Ltd., melamine resin, Cymel 325, nonvolatile 80% by weight), 0.9 part by weight of an acid catalyst (BYK Co., BYK Catalyst 450, nonvolatile about 40% by weight), the predetermined amount (see below) of a water repellent (a silicone compound or a fluorine-containing compound), and 101.6 parts by weight of methyl ethyl ketone. Using the coating composition thus obtained, a printing plate material was obtained in the same manner as in Example 4.

Example 8

A fluorine-containing silicone compound (Toagosei Chemical Industry Co., Ltd., Aron G GF-150, a fluorine-silicone-containing comb-shaped graft polymer), 0.5 part by weight

Example 9

A silicon-containing compound (Toagosei Chemical Industry Co., Ltd., Aron G GS-30, a silicon-containing comb-shaped graft polymer), 0.2 part by weight

Example 10

Polydimethylsiloxane (Toshiba Silicone Co., Ltd., TSF-451-100), 0.5 part by weight

Comparative Example 3

A printing plate material was obtained in the same manner as in Example 4 without addition of a water repellent.

Comparative Example 4

A printing plate material was obtained in the same manner as Example 7 except that the level of addition of the fluorine-containing water repellent (Toagosei Chemical Industry Co., Ltd., Aron G GF-300) was changed to 0.05 part by weight.

The surface wettability indexes of the photosensitive layers produced in Examples 4 to 10 and Comparative Examples 3 and 4 were respectively determined and the print background stains were evaluated by test printing. The results are shown in Table 2.

The wettability index was determined using the wetting reagent defined in JIS K6768 "Method of Wettability Test of Polyethylene and Polypropylene Films". The printing test was conducted using a water-based printing ink (Toyo Ink Manufacturing Co., Ltd., Aqua GEME 3 Red) and the results were evaluated according to the same criteria as described above.

TABLE 2

|  | Wettability index (dyne/cm) | Print background stain |
| --- | --- | --- |
| Example 4 | 32 | Excellent |
| Example 5 | 32 | Excellent |
| Example 6 | 33 | Excellent |
| Example 7 | 36 | Excellent |
| Example 8 | 35 | Excellent |
| Example 9 | 36 | Excellent |
| Example 10 | 32 | Excellent |
| Comparative Example 3 | 38 | Poor |
| Comparative Example 4 | 37 | Good |

It is apparent from Table 2 that the wettability indexes of the photosensitive layers of the printing plate materials obtained in Examples 4 to 10 were not greater than 36 dyne/cm and no background stain was found even when printing was carried out with a water-based printing ink.

The sensitivity of the photosensitive layer to laser light and the geometry of pints formed by laser irradiation were evaluated in the same manner as described hereinbefore. The sensitivity of the photosensitive layer and the pit geometry of the printing plate materials obtained in Examples 4 to 10 were invariably rated "Excellent".

Examples 11 to 13

A coating composition was prepared by mix-dispersing 7.7 parts by weight of nitrocellulose RS 1/4 (Daicel Chemical Industries, Ltd.), 24.6 parts by weight of a carbon black-containing paste (Toyo Ink Manufacturing Co., Ltd., Color Paste ANP-C-903 Black), 43.3 parts by weight of a polyester resin (Toyobo Co., Ltd., Vylon 20SS), 5.4 parts by weight of a crosslinking agent (Dainippon Ink and Chemicals, Inc., Super-Beckamine L-105-60), 0.4 part by weight of an acid catalyst (BYK Co., BYK Catalyst 450), and 18.7 parts by weight of methyl ethyl ketone.

The coating composition for a sensitive layer was coated in a dry thickness of 20 μm on each of the following 188 μm-thick biaxially stretched polyethylene terephthalate films each carrying an adhesive layer and dried at 120° C. for 3 minutes.

Example 11

Toyobo Co., Ltd., Espet A4100

Example 12

Toray Industries, Inc., Lumilar U98

Example 13

Teijin Limited, Tetron Film HP7

The sensitivity, pit geometry, solvent resistance (ethanol, chlorothene) and wear resistance (pencil hardness) of the photosensitive layer were evaluated. As in Example 1, satisfactory performance characteristics required for laser-sculptured printing plates were obtained.

Furthermore, the density of each polyethylene terephthalate film was determined by the water-submerged replacement method and the impact resistance of the printing plate material obtained in each example was determined with an impact tester (Toyo Seiki Seisakusyo Co., Ltd., a puncture tester). The results are shown in Table 3. For practical purposes, an impact strength of not less than 10 kg-cm is a minimum requirement.

Comparative Example 5

A printing plate material was obtained in the same manner as Example 11 except that a biaxially stretched polyethylene terephthalate film (ICI Co., Ltd., Merinex 542, 188 μm thick) was used in lieu of the film used in Example 11.

The impact resistance of the printing plate material obtained in Comparative Example 5 was evaluated in the same manner as above. The result is shown in Table 3. The printing plate material having a practically useful impact strength and the plate material not having a practically useful impact strength are indicated by the marks "O" and "X", respectively.

TABLE 3

| | Density of film (Water-submerged replacement method) | Impact strength (kg - cm) | Useful strength |
|---|---|---|---|
| Example 11 | 1.380 | 21.2 | O |
| Example 12 | 1.380 | 19.4 | O |
| Example 13 | 1.385 | 13.3 | O |
| Comparative Example 5 | 1.390 | 3.5 | X |

It is apparent from Table 3 that when the density of the support polyethylene terephthalate film exceeds 1.39, the impact resistance is remarkably decreased.

For investigating the influence of heat in the course of formation of a photosensitive layer, the film used in Comparative Example 5 was not coated with the coating composition but heat-treated under the conditions shown in Table 4 and subjected to the impact test described above. The results are shown in Table 4.

TABLE 4

| | Impact strength (kg - cm) |
|---|---|
| Non-treatment | 24.4 |
| 120° C. × 20 min. | 23.8 |
| 120° C. × 30 min. | 23.6 |
| 120° C. × 45 min. | 23.6 |

Since the film used in Comparative Example 5 underwent little decrease in impact resistance upon heat treatment as shown in Table 4, the observed decrease in impact resistance of Comparative Example 5 was considered not ascribable to heat but to other factors such as the formulation of the coating composition or a synergistic effect of coating formulation and temperature.

Reference Examples 1 to 3

Coating compositions were prepared in the same manner as in Example 1 except that, instead of the polyester resin used in Example 1, an acrylic resin (Rohm & Haas Co., Acryloid B-44, Reference Example 1), a modified polybutadiene resin (Nippon Soda Co., Ltd., BN 1015, Reference Example 2), and a vinyl chloride-vinyl acetate copolymer resin (Denki Kagaku Kogyo Co., Ltd., Denka Vinyl 1000C, Reference Example 3) were respectively used. Using each of these coating compositions, a printing plate material was obtained as in Example 1.

The sensitivity, pit geometry, solvent resistance and wear resistance (pencil hardness) of the photosensitive layers obtained in Examples 1 to 3 and Reference Examples 1 to 3 were evaluated in the same manner as above. The results are shown in Table 5.

TABLE 5

| | Species of resin | Sensitivity | Pit geometry | Solvent resistance | Wear resistance |
|---|---|---|---|---|---|
| Example 1 | Polyester | Excellent | Excellent | Excellent | Good |
| Example 2 | Polyester | Excellent | Excellent | Excellent | Excellent |
| Example 3 | Polyester | Excellent | Excellent | Excellent | Excellent |
| Reference Example 1 | Acrylic resin | Poor | Good | Excellent | Good |
| Reference Example 2 | Modified polybutadien resin | Poor | Good | Good | Good |
| Reference Example 3 | Vinyl chloride-vinyl acetate copolymer resin | Measurement is impossible | Poor | Good | Poor |

It is apparent from Table 5 that all the printing plate materials obtained in Examples 1 to 3 were not only sensitive enough to sculptured pits corresponding to laser beams but also were high in solvent resistance and wear resistance, thus being of use as laser-sculptured printing plates.

We claim:

1. A printing plate material comprising a photosensitive layer containing nitrocellulose having a nitrogen content of 11 to 12.5% and a degree of polymerization of 10 to 900 and a solution viscosity, of 10 to 1/8 second, carbon black, an organic binder, a crosslinking agent and a water repellent selected from the group consisting of a silicone compound and a fluorine-containing compound, and a support on which said photosensitive layer is formed, said photosensitive layer having (1) a surface roughness of not greater than Rmax. 1.5 µm and (2) a surface tension equivalent to a wettability index of 30 to 36 dyne/cm, wherein said printing plate material is used in association with a water-based printing ink, said organic binder is a thermoplastic polyethylene terephthalate copolymer that is soluble in methyl ethyl ketone, that is linear, noncrystalline and oil-free and that is obtained from terephthalic acid, ethylene glycol and at least one member selected from the group consisting of phthalic acid, isophthalic acid, adipic acid, azelaic acid, sebacic acid, propylene glycol, trimethylene glycol, 1,3-butanediol, 1,4-butanediol, 1,5-pentanediol, 1,6-hexanediol, neopentyl glycol, diethylene glycol, triethylene glycol, tetraethylene glycol, dipropylene glycol, tripropylene glycol, tetrapropylene glycol, cyclohexanediol, and cyclohexanedimethanol, said support is a biaxially stretched or oriented polyethylene terephthalate film having a density of 1.375 to 1.387 g/cm$^3$, and said photosensitive layer comprises 20 to 200 parts by weight of said nitrocellulose, 5 to 40 parts by weight of carbon black, 5 to 40 parts by weight of said crosslinking agent and 0.1 to 5 parts by weight of said water repellent relative to 100 parts by weight of said organic binder.

2. The printing plate material according to claim 1 wherein said support is a flexible transparent support on which said photosensitive layer is formed.

3. The printing plate material according to claim 1 wherein said photosensitive layer comprises 20 to 200 parts by weight of a nitrocellulose having a nitrogen content of 11.5 to 12.2% and a solution viscosity, of 1 to 1/8 second, 5 to 40 parts by weight of carbon black and 5 to 40 parts by weight of a crosslinking agent relative to 100 parts by weight of a thermoplastic polyethylene terephthalate copolymer, and said support is a transparent plastic film.

4. A printing plate material according to claim 1, wherein said photosensitive layer has (1) a surface roughness of not greater than Rmax. 1.0 µm or (2) a surface tension equivalent to a wettability index of 30 to 36 dyne/cm.

5. The printing plate material according to claim 4 wherein the surface of said photosensitive layer has a wettability index of 32 to 36 dyne/cm as imparted by said water repellent incorporated in said photosensitive layer and selected from the group consisting of silicone oil, silicone gum, and a silicone compound- or fluorine-containing compound-grafted polymer.

6. The printing plate material according to claim 5 wherein said water repellent is incorporated in a proportion of 0.2 to 2 parts by weight relative to 100 parts by weight of the photosensitive layer.

7. A printing plate material according to claim 1, which can be sculptured with laser light.

8. A method of producing a printing plate material which comprises coating a coating composition comprising nitrocellulose having a nitrogen content of 11 to 12.5% and a degree of polymerization of 10 to 900 and a solution viscosity, of 10 to 1/8 second, carbon black, an organic binder, a crosslinking agent and a water repellent selected from the group consisting of a silicone compound and a fluorine-containing compound on a biaxially stretched or oriented polyethylene terephthalate film having a density of 1.375 to 1.387 g/cm$^3$ to provide a photosensitive layer which can be sculptured with laser light, wherein said printing plate material is used in association with a water-based printing ink, said photosensitive layer has (1) a surface roughness of not greater than Rmax. 1.5 µm and (2) a surface tension equivalent to a wettability index of 30 to 36 dyne/cm, said organic binder is a thermoplastic polyethylene terephthalate copolymer that is soluble in methyl ethyl ketone that is linear, noncrystalline and oil-free and that is obtained from terephthalic acid, ethylene glycol and at least one member selected from the group consisting of phthalic acid, isophthalic acid, adipic acid, azelaic acid, sebacic acid, propylene glycol, trimethylene glycol, 1,3-butanediol, 1,4-butanediol, 1,5-pentanediol, 1,6-hexanediol, neopentyl glycol, diethylene glycol, triethylene glycol, tetraethylene glycol, dipropylene glycol, tripropylene glycol, tetrapropylene glycol, cyclohexanediol, and cyclohexanedimethanol, and said photosensitive layer comprises 20 to 200 parts by weight of said nitrocellulose, 5 to 40 parts by weight of carbon black, 5 to 40 parts by weight of said crosslinking agent and 0.1 to 5 parts by weight of said water repellent relative to 100 parts by weight of said organic binder.

* * * * *

UNITED STATES PATENT AND TRADEMARK OFFICE
CERTIFICATE OF CORRECTION

PATENT NO.   : 6,030,712
DATED        : February 29, 2000
INVENTOR(S)  : NOTSU Kazuo, FUNAKI Yoshinori It is certified that error appears in the above-indentified patent and that said Letters Patent is hereby corrected as shown below:

ON THE TITLE PAGE
After item [22] please insert item --[30] Foreign Application Priority Data, Aug. 13, 1993    [JP]    Japan ..................5-201473--.

Signed and Sealed this

Twenty-seventh Day of March, 2001

*Attest:*

NICHOLAS P. GODICI

*Attesting Officer*                Acting Director of the United States Patent and Trademark Office